United States Patent
Hampikian et al.

(10) Patent No.: US 8,008,816 B2
(45) Date of Patent: Aug. 30, 2011

(54) DEVICE WITH MAGNETOPLASTIC AND/OR MAGNETOELASTIC THIN-FILM TRANSDUCER AND PICK-UP COIL FOR HARVESTING ENERGY

(75) Inventors: Greg Hampikian, Boise, ID (US); Peter Mullner, Boise, ID (US)

(73) Assignee: Boise State University, Boise, ID (US)

( * ) Notice: Subject to any disclaimer, the term of this patent is extended or adjusted under 35 U.S.C. 154(b) by 410 days.

(21) Appl. No.: 11/875,732

(22) Filed: Oct. 19, 2007

(65) Prior Publication Data

US 2008/0143195 A1    Jun. 19, 2008

Related U.S. Application Data

(60) Provisional application No. 60/853,070, filed on Oct. 19, 2006.

(51) Int. Cl.
*H01L 41/00* (2006.01)
*H02N 2/00* (2006.01)

(52) U.S. Cl. ...................... 310/26; 73/862.333
(58) Field of Classification Search ............ 310/26, 310/339, 311
See application file for complete search history.

(56) References Cited

U.S. PATENT DOCUMENTS

| | | | | |
|---|---|---|---|---|
| 3,288,942 A | * | 11/1966 | Voegeli | 381/177 |
| 3,577,108 A | * | 5/1971 | Bengtson et al. | 336/20 |
| 4,364,013 A | * | 12/1982 | Castera et al. | 324/260 |
| 5,850,109 A | * | 12/1998 | Mock et al. | 310/26 |
| 5,958,154 A | | 9/1999 | O'Handley et al. | |
| 6,034,887 A | | 3/2000 | Gupta et al. | |
| 6,037,682 A | * | 3/2000 | Shoop et al. | 310/26 |
| 6,307,241 B1 | | 10/2001 | Awschalom et al. | |
| 6,433,465 B1 | * | 8/2002 | McKnight et al. | 310/339 |
| 6,515,382 B1 | * | 2/2003 | Ullakko | 310/26 |
| 6,655,035 B2 | | 12/2003 | Ghandi et al. | |
| 6,909,224 B2 | | 6/2005 | Ghandi et al. | |
| 6,927,475 B2 | * | 8/2005 | Lu | 257/532 |
| 6,984,902 B1 | | 1/2006 | Huang et al. | |

(Continued)

FOREIGN PATENT DOCUMENTS
WO    WO2008/049124 A2    4/2008
(Continued)

OTHER PUBLICATIONS

"Harvesting my Magnetostrictive material (MSM) for powering wireless sensor in SHM", Wang and Yuan, SPIE/ASME Best Student Paper Presentation Contest. Mar. 2007.*

(Continued)

*Primary Examiner* — Karl I Tamai
(74) *Attorney, Agent, or Firm* — Pedersen and Company, PLLC; Ken J. Pedersen; Barbara S. Pedersen

(57) ABSTRACT

A magnetoplastic and/or magnetoelastic material transduces linear motion, delivered to it by a mechanical connection, into a change of magnetic field, via twin boundary deformation. A bias magnetic field assures a net change of magnetization during the deformation, and a coil, coaxial with the magnetoplastic/elastic material, couples the magnetic field change to an electrical output. The bias magnetic field or a device that produces strain in a reverse direction resets the magnetomechanical transducer to its initial state. Microgenerators using the magnetoplastic/elastic material may be connected in series or parallel, combined with solar cells, and used to capture energy from passive motion such as random, cyclic or vibrational motion.

2 Claims, 7 Drawing Sheets

U.S. PATENT DOCUMENTS

| | | | |
|---|---|---|---|
| 6,995,496 | B1 | 2/2006 | Hagood, IV et al. |
| 7,009,310 | B2 | 3/2006 | Cheung et al. |
| 7,020,015 | B1 | 3/2006 | Hong et al. |
| 7,059,201 | B2 | 6/2006 | Prakash et al. |
| 7,199,495 | B2* | 4/2007 | Or et al. ............ 310/26 |
| 7,564,152 | B1* | 7/2009 | Clark et al. ......... 310/26 |
| 2006/0003185 | A1 | 1/2006 | Parkin |
| 2006/0130758 | A1 | 6/2006 | Lohokare et al. |
| 2006/0222904 | A1 | 10/2006 | Hsia et al. |
| 2008/0143195 | A1* | 6/2008 | Hampikian et al. ......... 310/26 |
| 2008/0225575 | A1* | 9/2008 | Mullner et al. ............ 365/157 |
| 2009/0092817 | A1* | 4/2009 | Mullner et al. .......... 428/304.4 |
| 2009/0167115 | A1* | 7/2009 | Tucker et al. ............... 310/339 |

FOREIGN PATENT DOCUMENTS

| | | |
|---|---|---|
| WO | WO2008/061166 A3 | 5/2008 |
| WO | WO2009/029953 A2 | 3/2009 |

OTHER PUBLICATIONS

"A magnetotrictive electric generator", Lundgren et al. Nov. 1993, IEEE transaction on magnetics, vol. 29, No. 6.*

Chernenko VA, Cesari E, Kokorin VV, Vitenko IN, The Develpment of New Ferromagnetic Shape Memory Alloys in Ni-Mn-Ga System, Scripta Metal Mater 1995;33:1239.

Chernenko VA, L'Vov VA, Pasquale M, Besseghini S, Sasso C, Polenur DA, Magnetoelastic Behavior of Ni-Mn-Ga Martensitic Alloys, Int J Appl Electromag Mech 2000;12:3.

Chernenko VA, Müllner P, Wollgarten M, Pons J, Kostorz G, Magnetic Field Induced Strains Caused by Different Martensites in Ni-Mn-Ga Alloys, J de Phys IV, 2003;112:951.

Ferreira PJ, Vander Sande JB, Magnetic Field Effects on Twin Dislocations, Scripta Mater 1999;41:117.

Jääskeläinen A, Ullakko K, Lindroos VK, Magnetic Field-Induced Strain and Stress in a Ni-Mn-Ga Alloy, J de Phys IV, 2003;112:1005.

Murray SJ, Marioni M, Allen SM, O'Handley RC, Lograsso TA, 6% Magnetic-Field-Induced Strain by Twin-Boundary Motion in Ferromagnetic Ni-Mn-Ga, Appl Phys Lett 2000a;77:886.

Murray SJ, Marioni M, Kukla AM, Robinson J, O'Handley RC, Allen SM, Large Field Induced Strain in Single Crystalline Ni-Mn-Ga Ferromagnetic Shape Memory Alloy, J Appl Phys 2000b;87:5774.

Müllner P, Between Microscopic and Mesoscopid Descriptions of Twin—Twin Interaction, Int J Mater Res(Z f Metallk) 2006;97:205.

Müllner P, Chernenko VA, Wollgarten M, Kostorz G, Large Cyclic Deformation of a Ni-Mn-Ga Shape Memory Alloy Induced by Magnetic Fields, J Appl Phys 2002;92:6708.

Müllner P, Chernenko VA, Kostorz G, A Microscopic Approach to the Magnetic-Field-Induced Deformation of Martensite (Magnetoplasticity), J Magn Magn Mater 2003a;267:325.

Müllner P, Chernenko VA, Kostorz G, Stress-Induced Twin Rearrangement Resulting in Change of Magnetization in a Ni-Mn-Ga Ferromagnetic Martensite, Scripta Mater 2003b;49:129.

Müllner P, Chernenko VA, Kostorz G, Large Magnetic-Field-Induced Deformation and Magneto-Mechanical Fatigue of Ferromagnetic Ni-Mn-Ga Martensites, Mater Sci Eng A 2004;387:965.

Müllner P, Ullakko K. The Force of a Magnetic/Electric Field on a Twinning Dislocation, Phys Stat Sol (b) 1998;208:R1.

Pond RC, Celotto S, Special Interfaces: Military Transformations, Intern Mater rev 2003;48:225.

Sozinov A, Likhachev AA, Lanska N, Ullakko K, Giant Magnetic-Field-Induced Strain in NiMnGa Seven-Layered Martensitic Phase, Appl Phys Lett 2002;80:1746.

Straka L, Heczko O, Magnetization Changes in Ni-Mn-Ga Magnetic Shape Memory Single Crystal During Compressive Stress Reorientation, Scripta Mater 2006;54:1549.

Soursa I, Pagounis E, Ullakko K, Magnetization Dependence on Strain in the Ni-Mn-Ga Magnetic Shape Memory Material, Appl. Phys. Lett. 2004a;23:4658.

Suorsa I, Tellinen J, Ullakko K, Pagounis E, Voltage Generation Induced by Mechanical Straining in Magnetic Shape Memory Materials, J Appl Phys 2004b;95:8054.

Tickle R, James RD, Magnetic and Magnetomechanical Properties of Ni2MnGa, J Magn Magn Mater 1999;195:627.

Ullakko K, Magnetically Controlled Shape Memory Alloys: A New Class of Actuator Materials, J Mater Eng Perf, 1996;5:405.

Ullakko K, Huang JK, Kantner C, O'Handley RC, Kokorin VV, Large Magnetic-Field-Induced Strains in Ni2MnGa Single Crystals, J Appl Phys 1996;69:1966.

J. Cui, T. W. Shield, R. D. James, Phase transformation and magnetic anisotropy of an iron-palladium ferromagnetic shape-memory alloy, Acta mater. 52, 35 (2004).

A. Fujita, K. Fukamichi, F. Gejima, R. Kainuma, K. Ishida, Magnetic properties and large magnetic-field-induced strains in off-stoichiometric Ni-Mn-Al Heusler alloys, Appl. Phys. Lett. 77, 3054 (2000).

R. D. James and M. Wuttig, Magnetostriction of martensite, Phil. Mag. A 77, 1273 (1998).

G. Kostorz and P. Müllner, Z. F., Magnetoplasticity, Metallkd. 96, 703 (2005).

H. H. Liebermann and C D Graham Jr Plastic and Magnetoplastic Deformation of Dy Single Crystals, Acta Met. 25, 715 (1976).

R. Santamarta, E. Cesari, J. Font, J. Muntasell, J. Pons, J. Dutkiewicz, Effect of atomic order on the martensitic transformation of Ni-Fe-Ga alloys, Scripta Mater. 54, 1985 (2006).

A. S. Sologubenko, P. Müllner, H. Heinrich K Kostorz, Z. F., On the plate-like τ-phase formation in MnAl-C alloys, Metallkd. 95, 486 (2004).

N. I. Vlasova, G. S. Kandaurova, N. N. Shchegoleva, J., Effect of the polytwinned microstructure parameters on magnetic domain structure and hysteresis properties of the CoPt-type alloys, Magn. Magn. Mater. 222, 138 (2000).

T. Wada, T. Tagawa, M. Taya, Martensitic transformation in Pd-rich Fe-Pd-Pt alloy, Scripta Mater. 48, 207 (2003).

M. Wuttig, J. Li, C. Craciunescu, A New Ferromagnetic Shape Memory Alloy System, Scripta Mater. 44, 2393 (2001).

J. H. Zhang, W. Y. Peng, S. Chen, T.Y. Hsu (X. Zaoyao), Magnetic shape memory effect in an antiferromagnetic γ-Mn-Fe(Cu) alloy, Appl. Phys. Lett. 86, 022506 (2005).

Chernenko Va, L'Vov Va, Cesari E, Martensitic Transformation in Ferromagnets: Experiment and Theory, J Magn Magn Mater 1999;196-197:859.

Karaman, et al., Energy Harvesting Using Martensite Variant Reorientation Mechanism in a NiMnGa Magnetic Shape Memory Alloy, Applied Physics Letters, 90, 172505 (2007). Published on-line Apr. 24, 2007.

Likhachev et al., Magnetic-field-cotrolled twin boundaries motion and giant magneto-mechanical effects in Ni-Mn-Ga shape memory alloy, Physics Letters, Oct. 2, 2000, pp. 142-151, vol. A 275, Elsevier Science.

Li et al., Some aspects of strain-induced change of magnetization in a Ni-Mn-Ga single crystal, Scripta Materialla, available online Jul. 6, 2005, pp. 829-834, vol. 53, Elsevier Ltd.

Boonyongmaneerat et al., Increasing Magnetoplasticity in Polycrystalline Ni-Mn-Ga by Reducing Internal Constraints through Porosity, Physical Review Letters, Dec. 14, 2007, pp. 247201-1 to 4, vol. 99, The American Physical Society.

PCT Search Report and the Written Opinion, PCT/US07/82021, May 21, 2008, Applicant: Boise State University.

PCT Search Report and the Written Opinion, PCT/US37/84732, May 22, 2008, Applicant: Boise State University.

PCT Search Report, PCT/US2008/075062, May 18, 2009, Applicant: Boise State University.

* cited by examiner

|  | $K$ [MJ/m³] | $M_S$ [MA/m] | $\tau_{M,max}$ [MPa] | $\varepsilon_{M,max}$ [%] | $\mu_0 H_a$ [T] |
|---|---|---|---|---|---|
| Ni₂MnGa | 0.25 | 0.5 | 2 | 10 | 1 |
| Dy | 44 | 3.0 | 220 | 10 | 30 |
| α-Fe | 0.05 | 1.1 | 0.07 | 35 | 0.06 |
| Co-Ni | 0.7 | 1.0 | 2 | 18 | 1.4 |
| τ-MnAl-C | 1 | 0.5 | 1.4 | 35 | 4 |
| L1₀ FePd | 2.2 | 1.0 | 3 | 35 | 4 |
| L1₀ CoPt | 4.9 | 0.8 | 7 | 35 | 12 |
| L1₀ FePt | 6.6 | 1.1 | 9 | 35 | 12 |

*Fig. 6*

| CATEGORY | MATERIAL | REFERENCE |
|---|---|---|
| HEUSLER SHAPE-MEMORY ALLOY | Ni$_2$MnGa | [KOSTORZ 2005] |
| | Co$_2$NiGa | [WUTTIG 2001] |
| | Ni$_2$MnAl | [FUJITA 2000] |
| | Ni$_2$FeGa | [SANTA 2006] |
| NON-HEUSLER FERROMAGNETIC SHAPE-MEMORY ALLOY | Fe$_3$Pd | [JAMES 1998] |
| | | [CUI 2004] |
| | Fe-Pd-Pt | [WADA 2003] |
| | L1$_0$CoPt | [VLASOVA 2000] |
| ANTIFERROMAGNETIC SHAPE-MEMORY ALLOY | γ-Mn-Fe-Cu | [ZHANG 2005] |
| | Dy | [LIEB. 1976] |
| NON SHAPE-MEMORY ALLOY | τ-MnAl-C | [SOLO. 2004] |

*Fig. 7*

DEVICE WITH MAGNETOPLASTIC AND/OR MAGNETOELASTIC THIN-FILM TRANSDUCER AND PICK-UP COIL FOR HARVESTING ENERGY

This application claims priority of Provisional Application Ser. No. 60/853,070, filed Oct. 19, 2006, the entire disclosure of which is hereby incorporated herein by this reference.

BACKGROUND OF THE INVENTION

1. Field of the Invention

The present invention relates to apparatus and methods using magnetoplastic and/or magnetoelastic materials for power generation. More specifically, the present invention relates to producing electrical current using magnetoelastic or magnetoplastic materials by "harvesting" or transducing energy from natural sources, especially from random, cyclic, and/or vibrational motion such as that produced by wind, waves, and human motion.

2. Related Art

Some magnetoplastic or magnetoelastic materials have been considered for use as actuators that convert electrical energy or changes in magnetic field to mechanical motion. Literature related to this topic is listed below:

Chernenko V A, Cesari E, Kokorin V V, Vitenko I N, Scripta Metal Mater 1995; 33:1239.
Chernenko V A, L'vov V A, Cesari E, J Magn Magn Mater 1999; 196-197:859.
Chernenko V A, L'vov V A, Pasquale M, Besseghini S, Sasso C, Polenur D A, Int J Appl Electromag Mech 2000; 12:3.
Chernenko V A, Müllner P, Wollgarten M, Pons J, Kostorz G, J de Phys IV, 2003; 112:951.
Ferreira P J, Vander Sande J B, Scripta Mater 1999; 41:117.
Jääskeläinen A, Ullakko K, Lindroos V K, J de Phys IV, 2003; 112:1005.
Murray S J, Marioni M, Allen S M, O'Handley R C, Lograsso T A, Appl Phys Lett 2000a; 77:886.
Murray S J, Marioni M, Kukla A M, Robinson J, O'Handley R C, Allen S M, J Appl Phys 2000b; 87:5774.
Müllner P, Int J Mater Res (Z f Metallk) 2006; 97:205.
Müllner P, Chernenko V A, Wollgarten M, Kostorz G, J Appl Phys 2002; 92:6708.
Müllner P, Chernenko V A, Kostorz G, J Magn Magn Mater 2003a; 267:325.
Müllner P, Chernenko V A, Kostorz G, Scripta Mater 2003b; 49:129.
Müllner P, Chernenko V A, Kostorz G, Mater Sci Eng A 2004; 387:965.
Müllner P, Ullakko K, Phys Stat Sol (b) 1998; 208:R1.
Pond R C, Celotto S, Intern Mater rev 2003; 48:225.
Sozinov A, Likhachev A A, Lanska N, Ullakko K, Appl Phys Lett 2002; 80:1746.
Straka L, Heczko O, Scripta Mater 2006; 54:1549.
Soursa I, Pagounis E, Ullakko K, Appl. Phys. Lett. 2004a; 23:4658.
Suorsa I, Tellinen J, Ullakko K, Pagounis E, J Appl Phys 2004b; 95:8054.
Tickle R, James R D, J Magn Magn Mater 1999; 195:627.
Ullakko K, J Mater Eng Perf, 1996; 5:405.
Ullakko K, Huang J K, Kantner C, O'Handley R C, Kokorin V V, J Appl Phys 1996; 69:1966.

Magnetoplastic materials, including ferromagnetic shape-memory alloys with twinned martensite, tend to deform upon the application of a magnetic field (Ullakko 1996, Murray et al. 2000, Chernenko et al. 2000). The magnetic-field-induced deformation can be irreversible (magnetoplasticity, Mullner et al. 2002, Mullner et al. 2003a) or reversible (magnetoelasticity, Chernenko et al. 2000, Ullakko et al. 1996). The magnetoplastic effect is related to the magnetic-field-induced displacement of twin boundaries, in an irreversible process. The magnetoelastic effect is also related to the magnetic-field-induced displacement of twin boundaries, but in a process that is at least somewhat reversible. While a strict definition of "elastic" would imply that magnetoelastic materials return without hysteresis to their initial state after removal of the magnetic-field, the term "magnetoelastic," as it is frequently used, may include materials that deform and return to their initial state upon removal of the magnetic field either without hysteresis or with some hysteresis.

While literature on the subject of magnetoplasticity and magnetoelasticity has indicated such materials to be relevant as actuators for converting electrical energy, or changes in magnetic field, to mechanical motion, the invention utilizes the reverse effect for power generation, that is, the effect of strain-induced change of magnetization due to twin deformation/rearrangement.

SUMMARY OF THE INVENTION

The invention comprises apparatus, and/or methods, that use motion, including random, cyclic, and/or vibrational motion, to produce electrical power, utilizing one or more materials that exhibit twin boundary deformation, also called "twin rearrangement," upon application of a force to the material(s). The invention comprises using one or more of said materials as a magnetomechanical transducer from mechanical action to magnetic field production.

The invented apparatus and/or methods may utilize energy from passive motion such as walking, or naturally-occurring random, cyclic or vibrations motion such as that produced by wind or waves acting upon objects. Said motion may be transferred, through a mechanical connecting device, to linear motion. or motion with a linear vector, that deforms a magnetoplastic and/or magnetoelastic material. The magnetoplastic and/or magnetoelastic material, by means of the twin boundary deformation effect, transduces the linear motion/component into a change of magnetic field. This strain-induced change of magnetization due to twin boundary deformation may be considered the reverse effect of magnetoplasticity and/or magnetoelasticity that is discussed in the above Related Art Section.

In preferred embodiments, a bias magnetic field is provided in the vicinity of the magnetomechanical transducer to assure a net change of magnetization during said deformation and rearrangement. The bias magnetic field may be provided by an electromagnet or a permanent magnet system. The change of magnetization induces an electrical signal by a suitable second transducer, such as a coil or a Hall element, which transforms magnetization change into current or voltage.

Magnetoplastic/magnetoelastic materials are uniquely suitable as magnetomechanical transducers for power generation due to their large range of deformation, small threshold stress and significant change of magnetization. Furthermore, magnetization and deformation are linearly coupled, yielding the same efficiency over the full deformation range. Therefore, preferred embodiments of the invented system are superior to existing power generators due to a long stroke, low threshold stress, and large change of magnetization. These properties provide high efficiency and power output. Furthermore, in embodiments using a coil as second transducer, a low-impedance electric output is produced, which does not need to be further transformed. The system is further advantaged by a simple design, providing great potential for miniaturization, nanotechnology, and ease and economy of fabrication.

The magnetomechanical transducer, and the invented apparatus and methods using the transducer, may provide microgenerators for power production by capturing kinetic energy and converting it to electrical power. The microgenerators, or other systems utilizing the invented magnetomechanical transducers, may be connected in series or parallel, combined with solar cells or other power generation devices, and used to capture energy from motion such as walking, machine movement, movement of water or wind, and/or object movement caused by water or wind.

DESCRIPTION OF THE DRAWINGS

The drawings illustrate demonstrations, descriptions, and schematics relating to preferred embodiments of the invented apparatus and methods, but are not intended to illustrate all embodiments or to necessarily limit the invention to the particulars shown therein.

FIG. 6 is a table of magnetic and magneto-mechanical properties of some but not all (potentially) ferromagnetic materials. Values surrounded by a rectangle being least favorable, and values surrounded by a triangle being most favorable.

FIG. 7 lists and categorizes many, but not all, magnetoplastic and potentially magnetoplastic materials, as well as citations to scientific literature discussing these materials. For materials that are circled in FIG. 7, magnetoplasticity has been demonstrated.

DETAILED DESCRIPTION OF THE PREFERRED EMBODIMENTS

Referring to the Figures, there are shown demonstrations, data, and schematics illustrating the preferred, but not the only, embodiments of the invention. The preferred embodiments make use of the deformation-induced-change of magnetization occurring in magnetoplastic and/or magnetoelastic materials, which magnetization change has been demonstrated by Müllner, et al. (Müllner P, Chernenko V A, Kostorz G, "Stress-induced twin rearrangement resulting in change of magnetization in a Ni—Mn—Ga ferromagnetic martensite," Scripta Mater 2003b; 49:129, the entire disclosure of which is hereby incorporated by this reference). As noted above, the deformation-induced (strain-induced) change of magnetization due to twin rearrangement is the reverse effect to magnetoplasticity or magnetoelasticity.

Numerous publications deal with many aspects of the ferromagnetic martensites in Ni—Mn—Ga alloys such as martensitic transformations and martensite structure (e.g. Chernenko et al. 1995), magnetic-field-induced deformation (e.g. Murray et al 2000a, Sozinov et al 2002) and the associated magneto-stress (Chernenko et al. 2000, Mullner et al. 2002, Tickle and James 1999, Chernenko et al. 1999, Murray et al. 2000b). However, only few results concerning the reverse effect have so far been published (Mullner et al 2003b, Soursa et al 2004a, Soursa et al 2004b, Straka et Heczko 2006; see Related Art Section).

The magnetoplastic effect is related to the magnetic-field-induced displacement of twin boundaries, which is a thermodynamically irreversible process (Ullakko 1996, Mullner et al 2002). On the microscopic scale, a twin boundary moves by the motion of twinning disconnections (Pond and Celotto 2002), a process which can be triggered by a magnetic force on the dislocation (Mullner and Ullakko 1998, Ferreira and Vander Sande 1999, Mullner 2006). In $Ni_2MnGa$, the cooperative motion of twinning dislocations finally leads to a strain of up to 10% (Müllner et al. 2004).

Uniaxial compression experiments under orthogonal magnetic field were done on a single crystal with composition $Ni_{51}Mn_{28}Ga_{21}$ (numbers indicate atomic percent). The sample was cut as a rectangular prism with {100} faces in all directions and measured 5.45(2) mm×3.26(2) mm×2.34(2) mm. In the ferromagnetic austenitic phase, i.e. above the reverse transformation temperature of 316 K, the sample was a single crystal with the ordered cubic $L2_1$ structure. At room temperature, the material is in the martensitic phase. The crystallographic directions a and c of all twin variants were parallel within 3° to the sample edges. The easy magnetization axis is parallel to the c direction.

Figure 1:
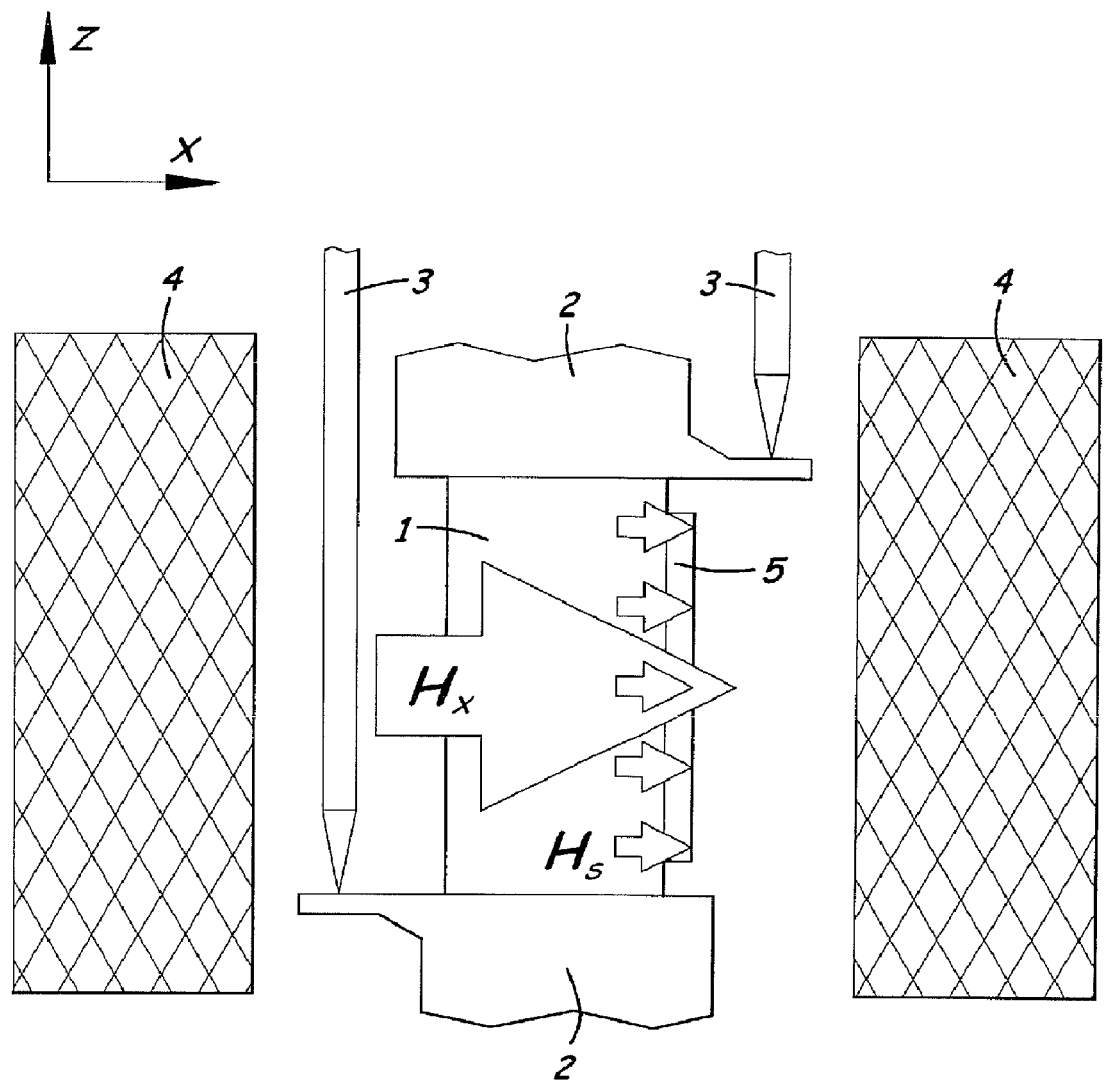
FIG. 1 shows the setup of the experiment with which deformation-induced change of magnetization was demonstrated.

The sample was deformed in uniaxial compression and unloaded at constant speed ($2 \times 10^{-6}$ M/s) in a mechanical testing machine equipped with a 500 N load cell and extensometers insensitive to magnetic fields. The magnetic field $\mu_0 H = 0.7$ T was produced by a permanent magnet system. The sample was mounted in such a way that the longest edge was parallel to the compression axis (z direction). The x direction was defined parallel to the shortest edge of the sample, x-y-z constitute Cartesian coordinates. The magnetic field was applied in x direction. A Hall probe was positioned close to one of the sample surfaces which were parallel to the y-z plane. The set-up of the experiment is outlined in FIG. 1, and may be described as follows. A magnetoplastic material in form of a parallelepiped (1) is fixed between two pressure pistons (2) that introduce the load. Two quartz glass push rods (3) transmit the displacement of the top and bottom surfaces of the sample/pistons to the extensometers (not shown on the figure). A Hallbach cylinder (cylindrical permanent magnet, 4) produces the magnetic field $H_x$ (large arrow). A Hall probe (5) measures the sum of $H_x$ and stray field $H_S$ (small arrows) on the side surface of the sample. The difference between measured field and $H_x$ is taken as a measure for the sample magnetization in the direction indicated by the mows.

Figure 2:
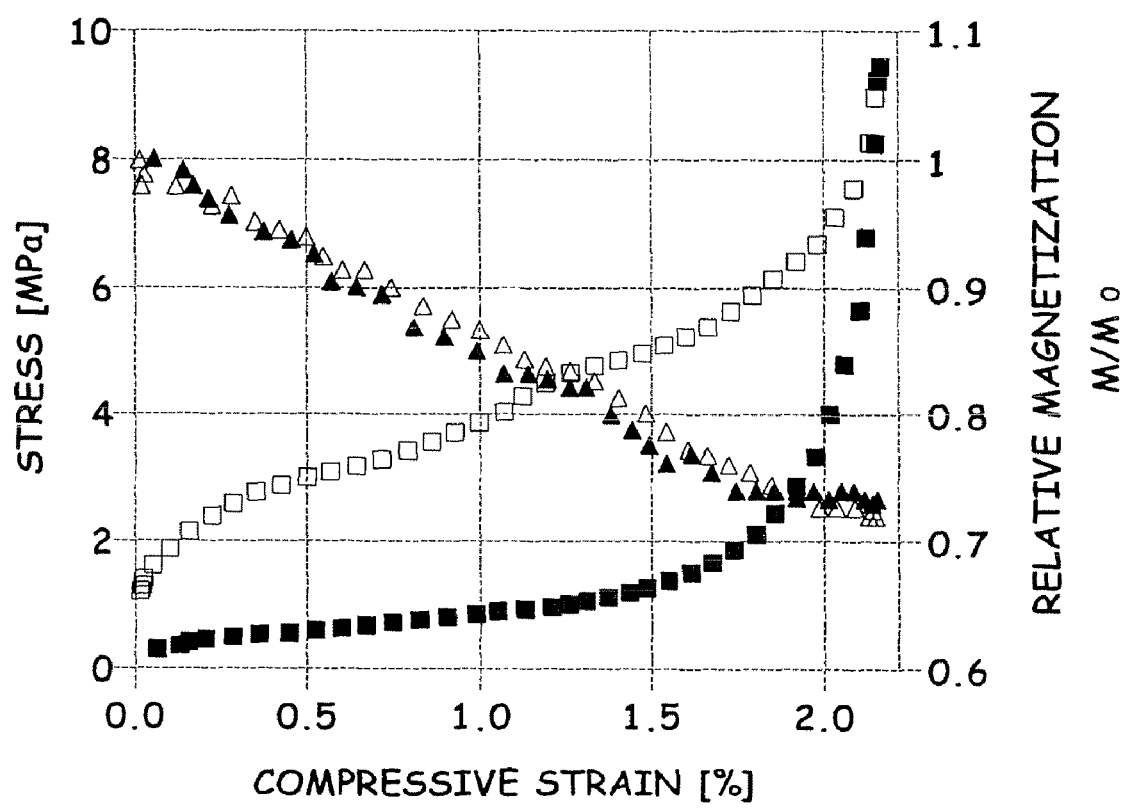
FIG. 2 gives stress (squares) and magnetization (triangles) as a function of compressive deformation along <100>direction of a $Ni_{51}Mn_{28}Ga_{21}$ single crystal measured at constant orthogonal magnetic field of 0.7 T along the x direction. Open and full symbols indicate values for increasing and decreasing deformation along the z direction.

FIG. 2 shows the results from the above experiment. Upon mechanical loading along the z direction at constant speed, the stress increases strongly at the beginning. The slope of the stress-strain curve decreases rapidly right after the onset of plastic deformation and is almost constant up to about 1.9% compressive strain and a corresponding stress of 6 MPa. At larger strain, the stress increases more rapidly. Over the whole deformation range, the relative magnetization in x direction $M_x/M_{x0} = (H-H_x)/(H_0-H_x)$ (H and M are the field detected with the Hall probe and the magnetization of the sample, $H_0$ and $M_0$ are the values in the undeformed state) decreases within experimental error linearly with increasing strain. Upon unloading, the stress decreases rapidly at the beginning and more slowly with decreasing strain until the full deformation is recovered. The relative magnetization increases again linearly until it reaches the initial value. The magnetization exhibits a negligible hysteresis. The slopes of the magnetization curves in both directions of deformation are constant and equal within experimental error over a wide range of strain whereas the stress curves have different shapes. More specifically, regarding FIG. 2, squares portray stress and triangles portray magnetization as a function of compressive deformation along <100> direction of a $Ni_{51}Mn_{28}Ga_{21}$ single crystal measured at constant orthogonal magnetic field of 0.7 T along the x direction. Open and full symbols indicate values for increasing and decreasing deformation along the z direction. Upon deformation, the stress increases quickly to about 1.5 MPa at 0.04% strain. Above 0.1% strain, stress increases slowly and almost linearly up to 1.9% strain. At larger strain, stress increases rapidly again. Upon unloading, the total strain is recovered, however at a lower stress level compared with loading. The magnetization along the x axis (divided by its value $M_0$ in the undeformed state) decreases linearly with increasing deformation up to 1.9%. Upon unloading, the magnetization restores its initial value with a small hysteresis.

Figure 3C:
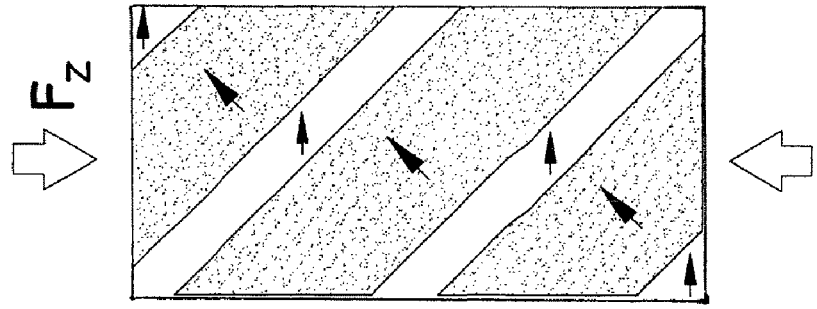
FIG. 3 (comprising 3a, 3b, and 3c) is a schematic of the magnetization process through deformation in magnetoplastic martensitic materials.
Figure 3B:
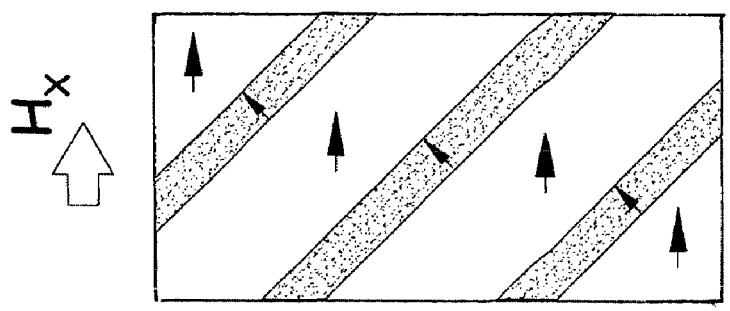
Figure 3A:
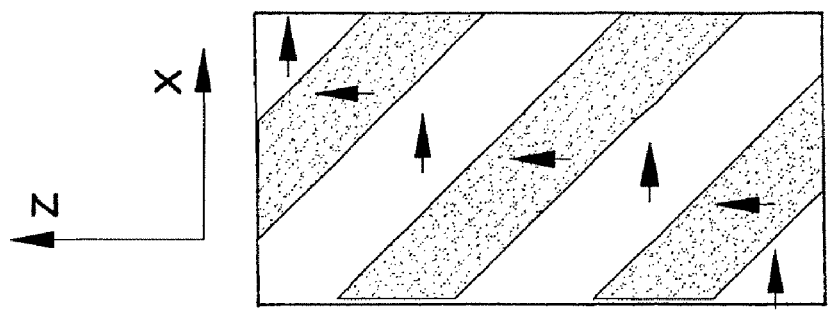

The twin rearrangement due to the action of a magnetic field and a mechanical force and the associated processes of deformation and magnetizing on the mesoscopic scale are shown schematically in FIGS. 3 (3a, 3b, and 3c). In the undeformed state and without magnetic field (FIG. 3a), the twin structure contains self-accommodated elastic domains with the crystallographic c directions distributed irregularly. In the absence of 180.degree. magnetic domains (which is always true for magnetic fields of 0.1 T and larger and even, in some cases, without application of a magnetic field), there is a considerable stray-field $H_S$ caused by domains with the axis of easy magnetization (which is parallel to the c direction) perpendicular to the surface. More specifically, in FIG. 3a, dark and bright gray indicate two twin variants. The local magnetization (arrows) aligns with the easy axis that is differently oriented for each twin variant. In FIG. 3b, under an applied magnetic field $H_x$, the twin boundaries move, causing growth of the twin variants with c parallel to the field. In the other twin variants, the magnetic moments rotate towards the direction of the magnetic field. In FIG. 3c, under an applied load ($F_z$), the twin boundaries move causing growth of one twin variant with c parallel to the load direction and shrinkage of the other. The specimen deforms since c<a. At the same time, the distribution of magnetic moments changes and alters the total magnetization.

In the schematic representation of FIGS. 3 (3a, 3b, and 3c), only one martensite domain with one set of twins is illustrated. Such a structure can be obtained after a suitable magnetic or mechanical treatment. In the present study, however, there are many martensite domains with differently oriented sets of twins.

When a magnetic field $H_x \gg 0.1$ T is applied along the x direction, the twin boundaries move in such a way, that the twins with c parallel to the x direction grow on the expense to twins with c perpendicular to the x axis (FIG. 3b). In regions, through which a twin boundary passes, the c direction switches from parallel to the z axis to parallel to the x axis. Since c/a<1, the sample shrinks along the x direction and expands along the z direction (magnetoplasticity). In addition to the motion of twin boundaries, the magnetic field $H_x$ causes the magnetic moments in the domains with c perpendicular to the x direction to rotate by an angle $\vartheta$ with $\sin \vartheta = H_x/H_A$ ($H_A$ is the saturation field) towards the x direction (FIG. 3b). In the present experiment, $H_x/H_A \cong 0.7$ and $\vartheta \cong 45°$. Owing to the rotation of the magnetic moments, the stray-field increases. The Hall probe (FIG. 1) detects the sum of the stray-field and the applied field.

When the sample is mechanically compressed along the z direction, the twin boundaries move in the opposite direction, i.e. the twins with c parallel to the z direction grow at the expense of twins with c perpendicular to the z axis (FIG. 3c). In regions, through which a twin boundary has passed, the c direction switched from parallel to the x axis to parallel to the z axis. Thereby, the direction of the magnetic moments rotates from parallel to the x axis to about 45° inclined to the x axis. This causes a reduction of the stray field which is detected by the Hall probe. Very close to the sample surface, the magnetic induction originating from the stray field is a linear function of the fractions of each twin variant. Since the strain is a linear function of the twin variant fractions, too, the signal of the Hall probe decreases linearly with strain (FIG. 2). Upon mechanical unloading, the reverse process occurs. The twin boundaries move again under the action of the magnetic field $H_x$ until the twin pattern and the shape of the unloaded state (FIG. 3b) are reached. Because, in the present experiments, strain and magnetization are controlled by the fractions of twin variants, there is no significant hysteresis between loading and unloading curves (FIG. 2).

The role of the magnetic bias field ($H_x$ in the above experiment) is twofold. First, the bias field removes all 180° domain boundaries and causes a net magnetization $M_x$ in x direction. This component of the magnetization induces voltage in the coil, for extraction of electrical power. Second, the magnetic bias field works against the applied force from the motion being "harvested" and restores the shape of the magnetoplastic and/or magnetoelastic material after removal of said force. The restoration of the shape implies a further change of magnetization generating electrical power, so that it is expected that some embodiments according the invention will generate electrical energy during the unloading and resetting step(s) of the process as well as the loading step. Below a bias field comparing (the same or generally the same) to the saturation field (about 1 T for $Ni_2MnGa$), the recoverable strain decreases and vanishes below a threshold field (Müllner P, Chernenko V A, Wollgarten M, Kostorz G, J Appl Phys 2002; 92:6708, the entire disclosure is incorporated herein by this reference). Alternatively, or additionally, restoration of the initial state may also be achieved through the application of a bias stress, for example, by a lever system forcing the shape of the magnetoplastic and/or magnetoelastic material back to the same or generally the same shape as the initial state.

It may be noted that the initial-state-resetting bias magnetic field and/or the alternative stress bias are preferably supplied continuously, or substantially continuously, throughout the power generating process, but, alternatively, could also be supplied intermittently and/or variably, for example, in-between loading steps (in-between periods when force is supplied from the motion being "harvested"). An intermittent or variable resetting bias would tend to be more complex, however. Further, even with an intermittent or variable initial-state-resetting device, it is desired to provide a continuous or substantially continuous magnetic bias for the reasons stated in the preceding paragraph.

Figure 4:
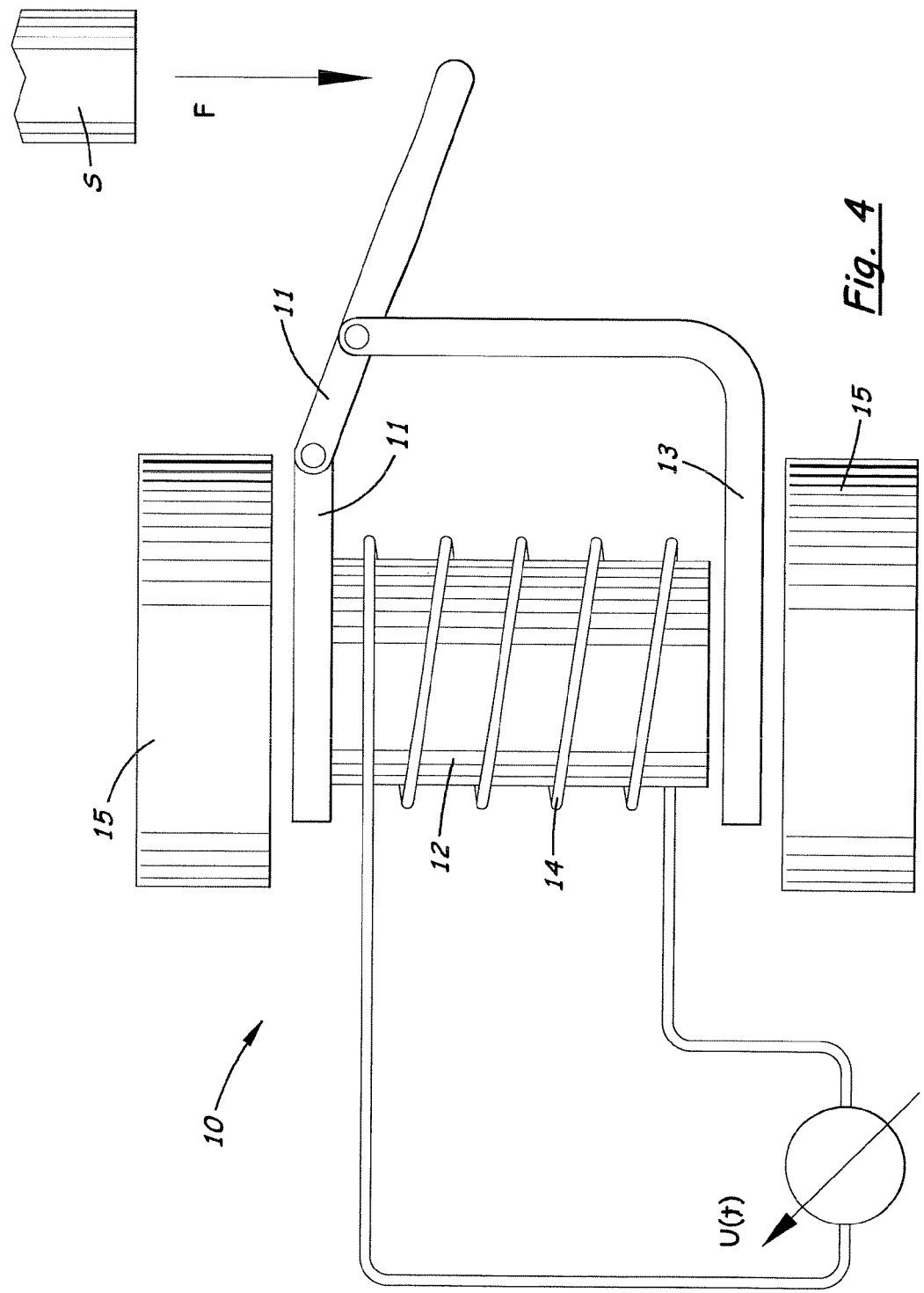
FIG. 4 is a schematic of one embodiment of a power generator 10 according the invention, wherein the force transmitted to the transducer is a tensile force.

FIG. 4 is a schematic of one embodiment of a power generator 10 according the invention, wherein the force transmitted to the transducer is a tensile force. A force F from source S, which may be a random force from nature or a force from movement of a machine or human, for example, acts though the lever (11) on the magnetoplastic transducer (12), wherein the lever (11) and the transducer (12) are attached to the frame (13). Motion of the lever (11) deforms the transducer (12), which changes the magnetization and induces a time dependent voltage U(t) in the pick-up coil (14). The magnetic bias field produced by the magnet (15) restores the initial state. It is preferred that the magnetic bias field has a component parallel to the direction along which the magnetization change is used to generate an electrical signal. For instance, if a coil is used as second transducer (FIG. 4), the bias field preferably has a component parallel to the coil axis. For magnetoplastic materials with c/a<1 and c being the easy axis of magnetization, the force F is preferably tensile if applied parallel to the bias field (FIG. 4) and compressive if applied perpendicular to the bias field. If c/a>1, the sign of the force must be changed. Alternatively, the magnetic bias field may be perpendicular to the direction along which the magnetization change is used to generate an electrical signal. Alternatively, the magnetic bias field may be inclined at an arbitrary angle to the direction along which the magnetization change is used to generate an electrical signal.

The force in FIG. 4 may be transferred from an object or material that is undergoing rotational, cyclic, random or vibrational motion, for example, from a machine, human, or naturally-occurring fluid or solid. The transfer of force may be direct when the force from the motion source is linear or substantially linear, or may be indirect, via conventional mechanical structures, when the force from the motion source is non-linear or substantially non-linear. Examples of conventional mechanical structures that may transfer force from a source or motion may include connectors such as a rod, string, lever, or any other connector. While the magnetoplastic and/or magnetoelastic material is placed under tension by the applied force in FIG. 4, alternative embodiments may be adapted to compress or bend the material, and/or otherwise move the material in any way that results in twin rearrangement. For example, preferred thin film transducer may be provided as a free-standing thin film or partially free-standing thin film that is flexed, bowed, or otherwise moved to produce said twin rearrangement. In the example of the thin film device of FIG. 5, the applied force may bow an unsupported portion of a thin piece of material that is supported/fixed around its periphery.

Figure 5A:
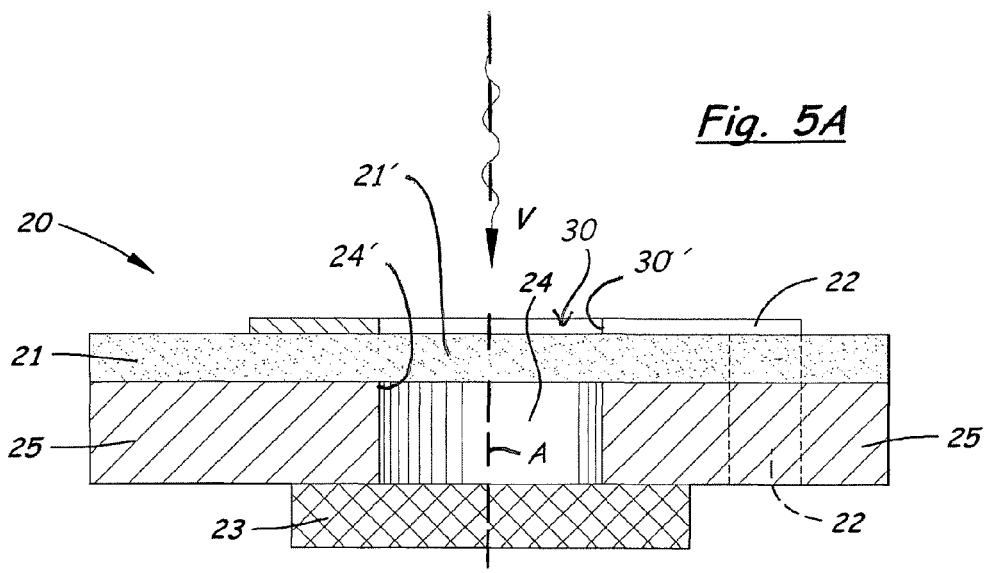
FIGS. 5 (5A and 5B) are schematics of one embodiment of a thin-film-based power generator 20.
Figure 5B:
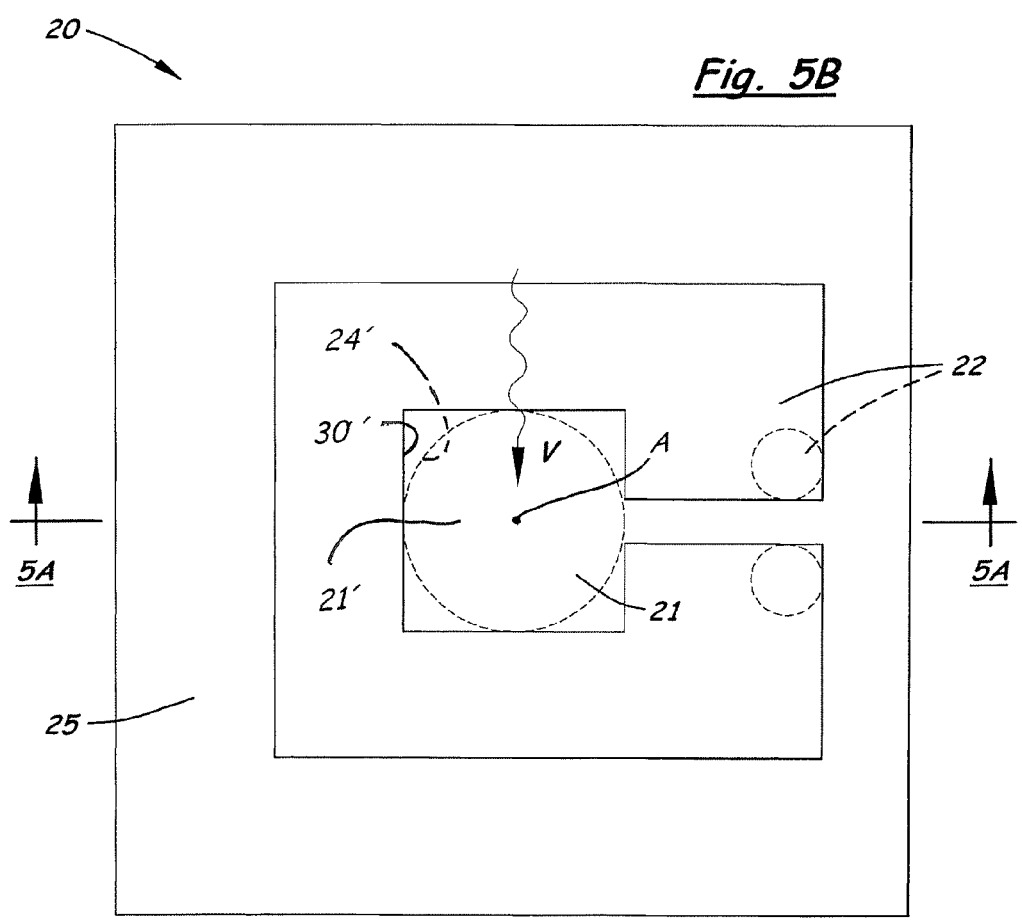

The device may be produced in any size or shape. Thin film technology may be used for small scale applications. FIGS. 5 (5A and 5B) shows a schematic of another embodiment of the invention that is a thin film device. The magnetomechanical transducer according to this embodiment is a magnetoplastic and/or magnetoelastic thin film which forms a free standing membrane over a window in a supporting substrate. The one-turn pick-up coil is made by a conducting thin film. Alternatively, multiple-turn pick-up coils may be used. The magnetic bias field is provided by a permanent magnet located at the back side of the device. Thin film methods for producing embodiments of the invention will be apparent to those of skill in the art upon viewing this disclosure and the drawings. More specifically, in the thin-film-based power generator 20 of FIGS. 5A and B, a vibration (V) causes a portion 21' of the magnetoplastic membrane 21 to bow and deform, wherein the portion 21' is over a hole 24 in support 25 that is defined by hole edge 24'. The deformation causes a change of magnetization, which induces a time dependent voltage in the one-turn thin-film pick-up coil 22. As shown in FIGS. 5A and B, coil 22 lies on the magnetoplastic membrane and has a coil opening 30 over said portion 21'. Coil opening 30 is defined by opening edge 30', and opening 30 is coaxial with longitudinal axis A of the hole 24 and of the portion 21'. The magnet 23 produces a magnetic bias field that restores the initial state. FIG. 5A is a side cross-sectional view, and FIG. 5B is a top view, of the micro-generator 20.

In many embodiments of the system, the motion to be transduced to electrical power is generated by wind, water, gas, particle flow, or vibration. For example, the system may be employed as part of a floatation device, wherein the motion of water is transduced to electrical power that may then be used to power a signaling or locator device. In other embodiments, a large number of small scale devices may be installed in a large area, such as an ocean beach or flowing waterway. In other embodiments, vibrational movement conducted through a solid medium is harvested and transduced to electrical power.

Other examples of motion that can be harvested and transduced by the system include human motion, which can be harvested to power personal electronic devices. For example the system can be employed by soldiers in the field to capture energy coincident with transportation of walking. One or more small devices may be attached to human clothing or footwear without being a heavy or cumbersome burden. Devices according to embodiments of the invention are expected to be efficient in transducing the movement to electrical energy. As calculated later in this document using the mass of the MSMA transducer, a micro-power-generator using a magnetic shape memory alloy (MSMA, which is one type of magnetoplastic and/or magnetoelastic material) as the magnetomechanical transducer, the power output due to the inverse magnetoplastic effect is estimated for an excitation frequency of 1 Hz to be 30 Ws/kg (equal to 30 mWs/g). If one assumes that the mass of a commercial device according to embodiments of the invention will be about 3-4 times the mass of the transducer (most of the additional mass being due to the permanent magnets and the copper coils), it is expected that a device with total mass 20 g (size about 1"×1"×¼") operated at 3 Hz will produce a power output of about 300-600 mW. Such a power output may be sufficient for the power supply of a cell phone, which typically requires about 250-400 W.

Preferred Materials

The materials used for the magnetomechanical transducer are those which produce a strain-induced change in magnetization. Specifically, materials with mobile twin boundaries are shown to produce said change in magnetization, which is a reverse/inverse effect to magnetoplasticity or magnetoelasticity. Therefore, the materials used for the magnetomechanical transducer may be selected from the broad categories of magnetoplastic and magnetoelastic materials, including from the following subsets of magnetoplastic and/or magnetoelastic: magnetic shape memory alloys (MSMA, which are ferromagnetic or "magnetic"); materials resulting from martensitic transformation (typically called "martensite"); and other providers of twins. The terms "magnetoplastic" and "magnetoelastic," as discussed above in the Related Art section, overlap to some extent, in that "magnetoelastic" is commonly used even for some materials that do exhibit hysteresis. Said magnetplasticity/magnetoelasticity (magnetoplastic/magnetoelastic materials) does not necessarily include all ferromagnetic materials, for example, preferably does not include "classical" magnetostriction (magnetostricitive materials). Whereas current magnetostrictive materials are limited to a maximum of about 0.2% strain (for Terfenol-D), the preferred magnetoplastic/magnetoelastic materials exhibit typically above 1% strain, and, in some embodiments, up to about 10% strain and possibly more. Further, the preferred magnetoplastic/magnetoelastic materials are not piezoelectric, and therefore the preferred magnetomechanical transducers are not piezoelectric, however, the inventors envision that there may be materials developed or discovered in the future that are both magnetoplastic/magnetoelastic and piezoelectric, and, hence, could be included in the preferred embodiments.

Requisite for magnetoplasticity is the magnetic-field-induced motion of twin boundaries. This requisite implies the following properties:
(i) The material must deform more easily by twinning than by dislocation motion.
(ii) The twinning stress must be less than the magnetostress $\tau_M$, i.e. the stress which can be induced through a magnetic field.

Factors affecting (i) above include the crystal structure (trend: lower symmetry is better than higher symmetry), the lattice potential (trend: strong bonding is better than weak bonding), the size of the lattice parameter (trend: larger is better than smaller). Factors affecting (ii) include the magnetic anisotropy constant K (the higher the better) and the twinning shear (the smaller the better).

Regarding applications, a large strain might be desirable. This implies a large twinning shear, which is in conflict with (ii). Furthermore, it is desirable to obtain magnetoplasticity with a small magnetic field. This implies a large saturation magnetization $M_s$. Thus, the desired materials properties are:
1. Large magnetic anisotropy K.
2. Large saturation magnetization $M_s$.
3. For large stress output: small twinning shear.
4. For large strain output: large twinning shear.

FIG. 6 summarizes magnetic and magneto-mechanical properties of some (potentially) ferromagnetic materials. Materials in FIG. 6 for which magnetoplasticity has been reported in the literature are circled. Embodiments of the invention may include one or more of the materials in FIG. 6, with values surrounded by a rectangle being least favorable, and values surrounded by a triangle being most favorable. The strain $\epsilon_{M,max}$ is proportional to the twinning shear and marks the theoretical maximum of magnetic-field-induced strain. The saturation field $\mu_0 H_a$ is the magnetic field at which the maximum magnetostress $\tau_{M,max}$ is reached. Further increase of the magnetic field does not increase the magnetostress.

Current research in the field of magnetoplasticity focuses on ferromagnetic shape-memory alloys, because in these materials, the twinning stress is very low. Particular attention is being paid to Heusler alloys, particularly off-stoichiometric $Ni_2MnGa$. Other ferromagnetic shape-memory alloys (i.e. non-Heusler alloys) which are under study include FePd, CoPt, FePt, and $Fe_3Pd$. Recently, magnetoplasticity was reported for an antiferromagnetic (AFM) magnetic shape-memory alloy γ-Mn—Fe—Cu (J. H. Zhang, W. Y. Peng, S. Chen, T. Y. Hsu (X. Zaoyao), Appl. Phys. Lett. 86, 022506 (2005)). Non-shape-memory alloys which have been studied in context of magnetoplasticity include dysprosium and τ-MnAl—C.

FIG. 7 lists and categorizes many magnetoplastic and potentially magnetoplastic materials, as well as citations to scientific literature discussing these materials. Embodiments of the invention may include one or more of the listed materials and/or one or more materials selected from the broad categories of materials. For materials that are circled in FIG. 7, magnetoplasticity has been demonstrated. The citations in FIG. 7 are:

| | |
|---|---|
| [Cui 2004] | J. Cui, T. W. Shield, R. D. James, Acta mater. 52, 35 (2004). |
| [Fujita 2000] | A. Fujita, K. Fukamichi, F. Gejima, R. Kainuma, K. Ishida, Appl. Phys. Lett. 77, 3054 (2000). |

-continued

| | |
|---|---|
| [James 1998] | R. D. James and M. Wuttig, Phil. Mag. A 77, 1273 (1998). |
| [Kostorz 2005] | G. Kostorz and P. Müllner, Z. f. Metallk. 96, 703 (2005). |
| [Lieb. 1976] | H. H. Liebermann and C. D. Graham, Jr. Acta Met. 25, 715 (1976). |
| [Santa. 2006] | R. Santamarta, E. Cesari, J. Font, J. Muntasell, J. Pons, J. Dutkiewicz, Scripta Mater. 54, 1985 (2006). |
| [Solo. 2004] | A. S. Sologubenko, P. Müllner, H. Heinrich, K. Kostorz, Z. f. Metallk. 95, 486 (2004). |
| [Vlasova 2000] | N. I. Vlasova, G. S. Kandaurova, N. N. Shchegoleva, J. Magn. Magn. Mater. 222, 138 (2000). |
| [Wada 2003] | T. Wada, T. Tagawa, M. Taya, Scripta Mater. 48, 207 (2003). |
| [Wuttig 2001] | M. Wuttig, J. Li, C. Craciunescu, Scripta Mater. 44, 2393 (2001). |
| [Zhang 2005] | J. H. Zhang, W. Y. Peng, S. Chen, T. Y. Hsu (X. Zaoyao), Appl. Phys. Lett. 86, 022506 (2005). |

Discussion of Features and Advantages of Preferred Embodiments

Current or "conventional" generators that harvest electrical energy from mechanical motion are based on piezoelectric transducers, magnetostrictive transducers, or induction due to the motion of a magnet. These conventional transducers and methods comprise at least one of the following disadvantages. (i) The strain which the conventional transducer can capture is small, typically much less than 1%. Since mechanical work density is proportional to strain (work is proportional to distance traveled), a small strain limits the power output (see, for example, the disclosures of U.S. Pat. No. 6,655,035 and U.S. Pat. No. 6,909,224). (ii) The threshold stress of conventional transducers is large. A large threshold stress leads to a severe hysteresis that causes loss by dissipation and reduces efficiency. (iii) Piezoelectric transducers produce a high-impedance charge signal which needs to be transformed to low-impedance voltage. (iv) A moving magnet, such as required for many conventional systems, causes only small relative changes of magnetic induction and permits only limited efficiency (see the disclosure of U.S. Pat. No. 5,568,005). Some of these devices have as their primary embodiments, acoustic or vibrational damping (see the disclosure of U.S. Pat. No. 6,995,496).

The preferred embodiments of the invention avoid all these issues. The advantages of the preferred embodiments include the following. (i) The strain that the preferred transducer can capture is large, typically more than 1%. Further, it may be noted that the current maximum strain covered by twin boundary motion in magnetic shape-memory alloys is 10%. Since mechanical work density is proportional to strain (work is proportional to distance traveled), a large strain permits large power output. (ii) The threshold stress for the preferred embodiments is low. A low threshold stress significantly reduces hysteresis and increases efficiency. (iii) The preferred magnetoplastic and/or magnetoelastic transducers produce a low-impedance voltage which does not need further transformation. (iv) The preferred magnetoplastic and/or magnetoelastic transducers produce a large change of magnetization (up to 30% or more depending on material), which causes a large change of magnetic induction leading to increased efficiency. (v) The design of the preferred system is very simple. The simplicity provides great potential for miniaturization, nanotechnology, and commercialization.

Thus, one advantage of the preferred embodiments is high efficiency and consequently high power density. Limits of these quantities can be estimated as follows. The maximum energy density $E_V$ which can be transformed by deformation of a magnetic shape-memory alloy, i.e. the output energy, equals the magnetic ansisotropy energy K. For obtaining the energy $E_m$ per kilogram, K needs to be divided by the density $\rho$ ($E_m=E_V/\rho$). The maximum power output $P_o$ is obtained by multiplying with the frequency v.

$$P_o = \frac{Kv}{\rho} \quad (1)$$

Eq. 1 assumes that the full anisotropy is recoverable. Since a magnetic bias field is required for the operation, a factor $f_b<1$ needs to be considered:

$$P_o = \frac{f_b Kv}{\rho} \quad (2)$$

During a full straining cycle, the mechanical hysteresis energy $E_{hme}$ is dissipated. During a full cycle, twice the output energy is gathered. Thus, the total power $P_i$ to put into the system is $$P_i = E_{hme}v + 2\frac{f_b Kv}{\rho} \quad (3)$$

The ratio of hysteresis energy and output energy equals the ratio of the width $\Delta\sigma_h$ of the mechanical hysteresis loop and the magnetostress $\sigma_M$:

$$\frac{E_{hme}}{E_m} = \frac{\Delta\sigma_h}{\sigma_M} = \frac{P_{loss}}{P_o} = g \quad (4)$$

where $P_{loss}$ is the power loss during one cycle. From (2-4) follows the efficiency $\eta$:

$$\eta = \frac{2P_o}{P_i} = \frac{2}{2+g} \quad (5)$$

The width of the hysteresis loop is about twice the yield stress $\sigma_y$ and $\sigma_M=2K/s$ where s is the twinning shear. For current Ni—Mn—Ga magnetic shape-memory alloys, $g\approx 1$ and $\eta\approx 67\%$. Thus, about 67% of the mechanical energy (motion) can be transformed into electrical energy. For Ni—Mn—Ga, $K\approx 250$ kJ/m$^3$, $\rho=8$ g/cm$^3$, $f_b\approx 0.5$. This gives for a frequency of 1 Hz a power output $2P_o$ of about 30 W/kg, and for a 1 kHz vibration about 30 kW/kg (referring to the mass of the transducer). For high-frequency applications, losses due to induction should be considered.

Although this invention has been described above with reference to particular means, materials, and embodiments, it is to be understood that the invention is not limited to these disclosed particulars, but extends instead to all equivalents within the scope of the following claims.

The invention claimed is:

1. A magnetomechanical device for harvesting energy from random, cyclic or vibrational motion, the device comprising:
    a support with a hole extending into the support, the hole having an opening and a longitudinal axis;
    a magnet connected to said support and providing a magnetic bias,
    a first thin-film transducer on said support and having a portion extending over the hole and coaxial with said hole longitudinal axis, said portion comprising magnetoplastic and/or magnetoelastic material that, upon deformation of the material into said hole by an applied force, produces a net change in magnetization relative to said magnetic bias by twin boundary rearrangement, wherein said portion is coaxial with said longitudinal axis of the hole; and
    a one-turn conducting-thin-film pick-up coil on said first thin-film transducer and having a coil opening that is over said portion of the first thin-film transducer, wherein the coil opening is coaxial with the hole and with said portion, and wherein said applied force reaches said portion of the first thin-film transducer through the coil opening, and the conducting-thin-film pick-up coil transduces magnetization to electrical energy;
    wherein said first transducer resides in an initial state prior to deformation by said applied force, and wherein the magnet is adapted to reset said material to the initial state after said deformation.

2. A system as in claim 1, wherein the first thin-film transducer comprises material selected from the group consisting of: Heusler shape-memory alloy, non-Heusler ferromagnetic shape-memory alloy, antiferromagnetic shape-memory alloy, non-shape-memory magnetoplastic alloy, Ni.sub.2MnGa, Dy, .alpha.-Fe, Co—Ni, .tau.-MnAl—C, L1.sub.OFePd, L1.sub.0CoPt, L1.sub.OFePt, Ni.sub.2MnGa, Co.sub.2NiGa, Ni.sub.2MnAl, Ni.sub.2FeGa, Fe.sub.3Pd, Fe—Pd—PT, .gamma.-Mn—Fe—Cu, Ni.sub.51Mn.sub.28Ga.sub.21, Ni—Mn—Ga alloys, Ni—Mn—Ga ferromagnetic martensite, and combinations thereof.

* * * * *